(12) United States Patent
Poiesz

(10) Patent No.: US 10,310,393 B2
(45) Date of Patent: Jun. 4, 2019

(54) SUBSTRATE SUPPORT, METHOD OF COMPENSATING UNFLATNESS OF AN UPPER SURFACE OF A SUBSTRATE, LITHOGRAPHIC APPARATUS AND DEVICE MANUFACTURING METHOD

(71) Applicant: ASML Netherlands B.V., Veldhoven (NL)

(72) Inventor: Thomas Poiesz, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/737,399

(22) PCT Filed: Apr. 28, 2016

(86) PCT No.: PCT/EP2016/059519
§ 371 (c)(1),
(2) Date: Dec. 18, 2017

(87) PCT Pub. No.: WO2016/206839
PCT Pub. Date: Dec. 29, 2016

(65) Prior Publication Data
US 2018/0188660 A1    Jul. 5, 2018

(30) Foreign Application Priority Data

Jun. 22, 2015 (EP) .................... 15173172

(51) Int. Cl.
*G03F 7/20* (2006.01)
(52) U.S. Cl.
CPC .......... *G03F 7/70783* (2013.01); *G03F 7/707* (2013.01); *G03F 7/70525* (2013.01)

(58) Field of Classification Search
CPC ... G03F 7/70783; G03F 7/707; G03F 7/70525
USPC ...................................... 355/72–76
See application file for complete search history.

(56) References Cited

U.S. PATENT DOCUMENTS

| 5,094,536 A | 3/1992 | MacDonald et al. |
| 6,927,839 B2 * | 8/2005 | Taniguchi ........... G03F 7/70783 355/72 |

(Continued)

FOREIGN PATENT DOCUMENTS

| JP | H01-218020 A | 8/1989 |
| JP | H06-208942 A | 7/1994 |

(Continued)

OTHER PUBLICATIONS

International Preliminary Report on Patentability directed to related International Patent Application No. PCT/EP2016/059519, dated Dec. 26, 2017; 7 pages.

(Continued)

*Primary Examiner* — Hung Nguyen
(74) *Attorney, Agent, or Firm* — Sterne, Kessler, Goldstein & Fox P.L.L.C.

(57) ABSTRACT

The present invention relates to a substrate support (1), comprising:
a support body (2) forming a support surface configured to support a substrate, wherein said support surface comprises a support surface part configured to support a substrate area of the substrate,
at least one actuator (6) arranged on the support body at a location aligned with the support surface part and configured to contract or extend in a direction substantially parallel to a main plane of the support surface.

13 Claims, 4 Drawing Sheets

(56) References Cited

U.S. PATENT DOCUMENTS

| | | | |
|---|---|---|---|
| 2004/0233404 A1 | 11/2004 | Hayashi | |
| 2005/0068510 A1 | 3/2005 | Bleeker et al. | |
| 2005/0134829 A1* | 6/2005 | Ottens | G03F 7/707 |
| | | | 355/75 |
| 2007/0195306 A1 | 8/2007 | Yun | |
| 2011/0222039 A1 | 9/2011 | Valentin et al. | |
| 2011/0292369 A1* | 12/2011 | Lafarre | G03F 7/707 |
| | | | 355/72 |
| 2012/0026480 A1 | 2/2012 | Loopstra et al. | |
| 2012/0327386 A1 | 12/2012 | Huang et al. | |
| 2013/0164688 A1 | 6/2013 | Cadee et al. | |

FOREIGN PATENT DOCUMENTS

| | | |
|---|---|---|
| JP | 2006-186223 A | 7/2006 |
| JP | 2007-123560 A | 5/2007 |
| JP | 2011-060823 A | 3/2011 |
| JP | 2013-042175 A | 2/2013 |
| JP | 2013-191601 A | 9/2013 |
| JP | 2014-183253 A | 9/2014 |
| JP | 2015-088590 A | 5/2015 |
| WO | WO 2012/081234 A1 | 5/2014 |
| WO | WO 2014/063871 A1 | 5/2014 |

OTHER PUBLICATIONS

International Search Report and Written Opinion of the International Searching Authority directed to related International Patent Application No. PCT/EP2016/059519, dated Jan. 8, 2016; 10 pages.

* cited by examiner

SUBSTRATE SUPPORT, METHOD OF COMPENSATING UNFLATNESS OF AN UPPER SURFACE OF A SUBSTRATE, LITHOGRAPHIC APPARATUS AND DEVICE MANUFACTURING METHOD

CROSS REFERENCE TO RELATED APPLICATION

This application claims priority of EP application 15173172.6 which was filed on 2015 Jun. 22 and which is incorporated herein in its entirety by reference.

BACKGROUND

Field of the Invention

The present invention relates to a substrate support, a method of compensating an unflatness of an upper surface of a substrate loaded on a substrate support, a lithographic apparatus and a device manufacturing method.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus a substrate support is provided to support a substrate during transfer of a pattern of the patterning device onto the substrate. To ensure that the pattern is properly transferred from the patterning device to the target portion of the substrate, it is of importance that the upper surface is properly aligned with the patterned beam incident on the upper surface. Unflatness of the upper surface of the substrate is therefore undesirable. However, in practice the upper surface of the substrate may be unflat for example caused by wafer shape deformation or by unflatness of the support surface of the substrate table supporting the substrate.

To compensate the effect of the unflatness of the upper surface of the substrate, the relative position of the substrate with respect to the patterned beam incident on the substrate is adapted to optimize the position of the target portion with respect to the patterned beam. For each target portion one optimal position can be determined, in which position a plane is determined and aligned with the patterned beam. This so-called leveling may compensate first order unflatness of the upper surface of the substrate within the target portion.

However within a target portion, also higher order unflatness of the upper surface of the substrate loaded on the substrate support may occur. This higher order unflatness may in particular occur in the edge area of the substrate and may be caused by different reasons.

For example, the edge area of the substrate itself may be curved. Also, the support surface of the substrate support on which the substrate is loaded may be unflat.

In a known embodiment of the substrate support, the substrate support comprises burls forming the support surface for supporting the substrate. Due to wear and/or polishing, the outer burls of the support surface, i.e. the burls supporting the edge area of the substrate, tend to have a lower height than the other burls of the support surface. This difference in height also results in an unflatness of the support surface of the substrate support, and, as a consequence, in an unflatness of the upper surface of a substrate loaded on the support surface.

SUMMARY

It is desirable to provide a substrate support having a substrate support surface for supporting a substrate, wherein unflatness of an edge area of the upper surface of the substrate loaded on the support surface is compensated.

Furthermore, it is desirable to provide a method to compensate unflatness of the upper surface of the substrate loaded on a substrate support.

According to an aspect of the invention, there is provided a substrate support, comprising:

a support body forming a support surface configured to support a substrate, wherein said support surface comprises a support surface part configured to support a substrate area of the substrate, at least one actuator arranged on the support body at a location aligned with the support surface part and configured to contract or extend in a direction substantially parallel to a main plane of the support surface, wherein, upon actuation, the at least one actuator is configured and arranged to locally bend the support body in order to compensate an unflatness of an upper surface of an area of a substrate loaded on the support surface.

According to an aspect of the invention, there is provided a method of compensating an unflatness of an upper surface of a substrate area of a substrate loaded on a support surface of a support body of a substrate support, wherein the substrate support comprises at least one actuator mounted on the support body and configured to contract or extend in a direction substantially parallel to a main surface of the substrate loaded on the substrate support, wherein the method comprises actuating the at least one actuator to extend and/or contract on the basis of data representative for unflatness of the upper surface of the substrate area of the substrate loaded on the substrate support, in order to create locally a curve in the support body, wherein the curve of the support body substantially compensates the unflatness of the upper surface of the substrate area.

According to an aspect of the invention, there is provided a lithographic apparatus configured to transfer a pattern from a patterning device onto a substrate, comprising: a substrate support, the substrate support comprising:

a support body forming a support surface configured to support a substrate, wherein said support surface comprises a support surface part configured to support a substrate area of the substrate, at least one actuator arranged on the support body at a location aligned with the support surface part and configured to contract or extend in a direction substantially parallel to a main plane of the support surface, wherein, upon actuation, the at least one actuator is configured and arranged to locally bend the support body in order to compensate an unflatness of an upper surface of an area of a substrate loaded on the support surface.

According to an aspect of the invention, there is provided a device manufacturing method comprising transferring a pattern from a patterning device onto a substrate, wherein the method comprises the step of loading the substrate on a support surface of a support body of a substrate support, wherein the substrate support comprises at least one actuator mounted on the support body and configured to contract or extend in a direction substantially parallel to a main surface of the substrate loaded on the substrate support, wherein said loading step comprises actuating the at least one actuator to extend and/or contract on the basis of data representative for unflatness of the upper surface of the substrate area of the substrate loaded on the substrate support, in order to create locally a curve in the support body, wherein the curve of the support body substantially compensates the unflatness of the upper surface of the substrate area.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
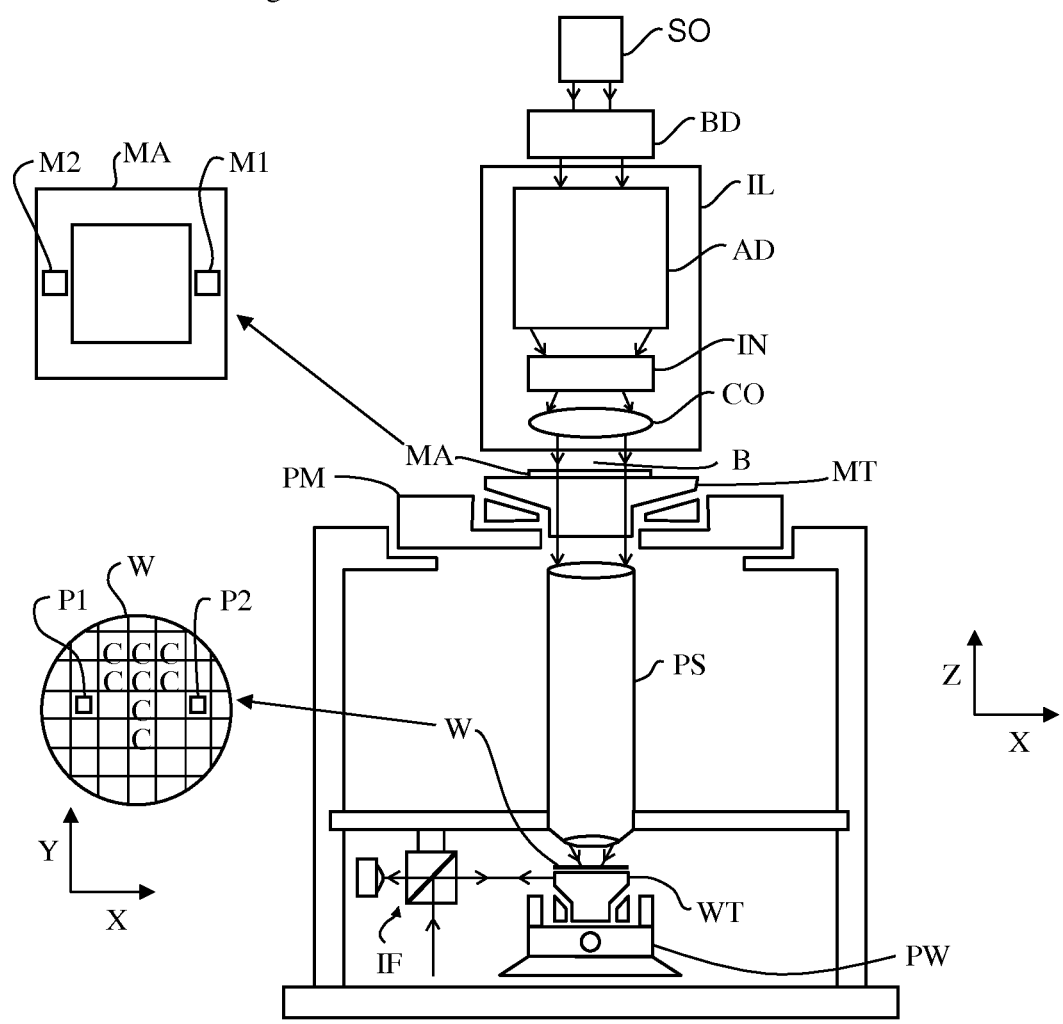
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Figure 2:
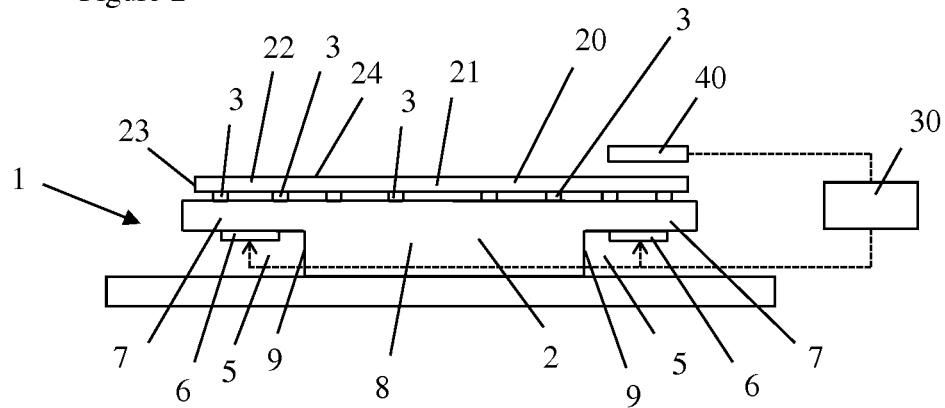
FIG. 2 depicts a cross section view of a first embodiment of a substrate support according to the invention.

FIG. 2 shows schematically a cross section of a substrate support 1 of a lithographic apparatus. The substrate support 1 comprises a support body 2 and multiple burls 3 extending from the support body 2 and forming, at their top sides, a support surface for supporting the substrate 20, as shown in FIG. 2. The space between the burls 3 may for example be used to create a vacuum space to clamp the substrate 20 on the support surface.

Figure 3:
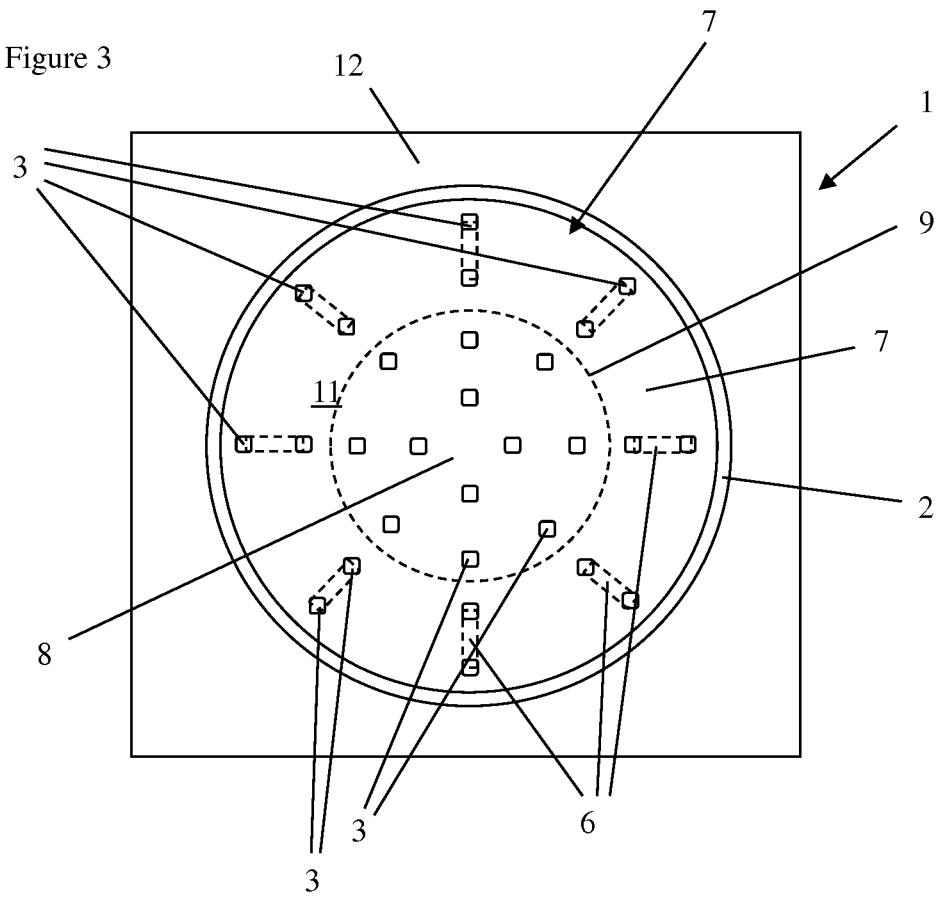
FIG. 3 depicts a top view of the substrate support of FIG. 2.

FIG. 3 shows schematically a top view of the substrate support of FIG. 2. It is remarked that, in practice, the substrate support 1 may comprise substantially more burls 3 forming the support surface as shown in FIGS. 2 and 3, and the distance between the burls 3 may be substantially smaller as suggested in FIGS. 2 and 3.

The substrate 20 is a substantially circular plate shaped element comprising a central area 21 and an annular edge area 22 extending along the circular edge 23 of the substrate 20. Ideally, the substrate is a perfectly flat element, but in practice the substrate may comprise unflat upper and lower surfaces.

The burls 3 are arranged in concentric circles that extend from the center point of the support surface. The inner circles of burls 3 are provided to support the central area 21 of the substrate 20, while the two outer circles of burls 3 are provided to support the edge area 22 of the substrate 20. To properly transfer a pattern from a patterning device to the substrate 20, the upper surface 24 of the substrate 20 should properly aligned with the patterned beam incident on the substrate 20. When the support surface and the substrate 20 are perfectly flat, the upper surface 24 would always be properly aligned with the patterned beam incident on the upper surface 24.

However, in practice, unflatness of the upper surface 24 usually occurs. For example, the substrate may be warped. It is known to optimize the position of the upper surface 24 of the substrate 20 for each target portion of the substrate, i.e. for each target portion an optimal position of the upper surface is determined and the substrate support is moved in six degrees of freedom to hold the target position in this optimal position for the optimal transfer of the desired pattern onto the substrate 20. This so-called leveling is in particular useful if the unflatness within the target portion can be modeled as a first order unflatness so that the flatness can be compensated by holding the target portion in the optimal position. The unflatness may also be of higher order within the dimensions of a target portion. In such case the unflatness can less properly be compensated by leveling. This higher order unflatness typically occurs in the edge area 22 of the upper surface 24 of the substrate 20.

This higher order unflatness may be caused by one or more of the following reasons; the edge area 22 of the substrate is deformed or the support surface of the substrate support is unflat. The unflat support surface is typically caused by wear or polishing of the burls 3, whereby the burls 3 of the outer circle are lower than the other burls.

In all these cases the upper surface 24 of the substrate 20 in the edge area 24 usually curls down. This curling down may be relatively steep as a consequence of which compensation of the unflatness cannot or only partly be compensated by leveling during transfer of a pattern from the patterning device to the substrate 20.

In order to further compensate the unflatness in an edge area 22 of the substrate, the substrate support 1 is provided with an undercut 5 extending over the circumference of the edge support surface, i.e. the part of the support surface that is configured to support the edge area 22 of the substrate 20 loaded on the substrate support 1.

In the undercut 5, piezo actuators 6 are arranged on the substrate support 1. A first end of each of the piezo actuators 6 is aligned with a burl of the most outer circle of burls 3, and the opposed second end of the piezo actuators 6 is aligned with a burl of the adjacent circle of burls 3. The piezo actuators extend in a plane substantially parallel to the support surface and therewith to a main plane of the substrate 20 supported on the support surface. Furthermore, the piezo actuators 6 extend substantially radially with respect to the center of the support surface and a substrate loaded on the support surface.

The undercut 5 is provided to increase the flexibility of the support body edge part 7 so that the piezo actuators 6 are capable of bending the support body edge part 7, when desired. At the same time, the sharp transition 9 in thickness from the support body edge part 7 to the center part 8 of the support body ensures that the bending of the support body 2 will substantially only occur in the support body edge part 7 and not partly within the center part 8 of the support body 2.

Elongation of the piezo-actuators 6 will result in that the free end of the support body edge part 7 of the support body 2 will curve upwardly. As a result, the burls 3 of the outer ring will move upwards with respect to the other burls 3. This will cause the upper surface of the substrate edge area 22 to move upwards with respect to the upper surface of the rest of the substrate 20. Thus elongation of the piezo-actuators 6 may result in compensation of a curl down of the edge of the substrate 20.

Figure 4:
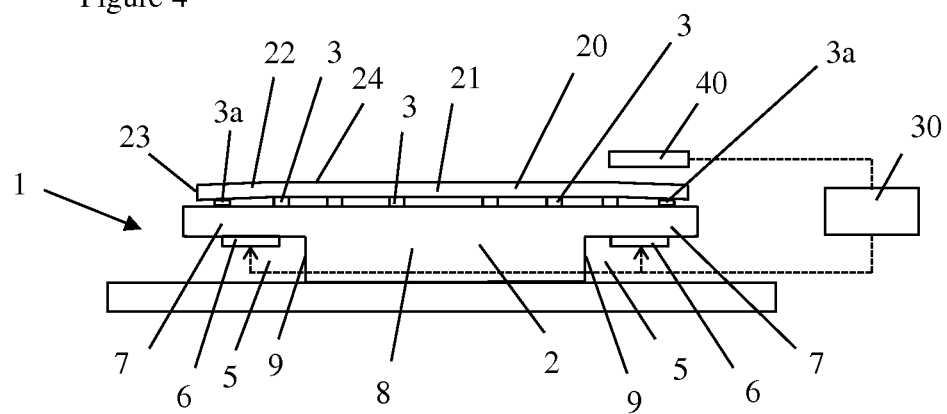
FIG. 4 depicts a cross section view of the substrate support before unflatness of FIG. 2 compensation.

For example, FIG. 4 shows the substrate support 1 of FIG. 2, wherein the outer burls 3a have a smaller height than the height of the burls 3 of the rest of the support surface. As a result, the outer edge 23 of the substrate 20 is curled down resulting in an unflat upper surface 24 of the substrate. In practice the steepness of the unflatness may be so large that the unflatness cannot be properly compensated by leveling of the substrate support during transfer of a pattern on the substrate.

Figure 5:
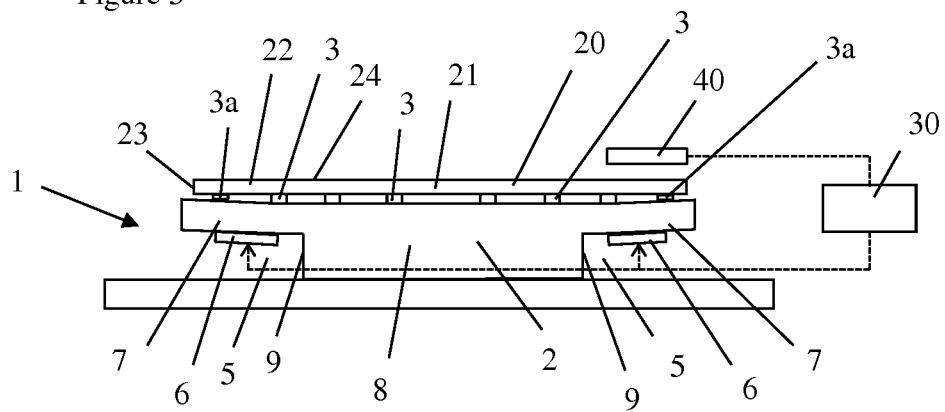
FIG. 5 depicts a cross section view of the substrate support of FIG. 2 after unflatness compensation.

The lower height of the outer burls 3a may be compensated by elongation of the piezo actuators 6. As shown in FIG. 5, actuation of the piezo-actuators 6 results in elongation of the piezo actuators. As a consequence the edge part 7 of the substrate support is curved upwards and the outer burls 3a are moved upwards to substantially the same level as the height of the other burls 3 of the substrate support 1. As a result, the unflatness of the upper surface 24 of the edge area 22 of the substrate 20 is substantially reduced.

It will be clear that contraction or shortening of the piezo actuators 6 will result in a curving down of the free end of the support body edge part 7 and downward movement of the outer ring of burls 3a. This movement can be used when it is desirable to move the outer edge of the substrate 20 downwards to compensate unflatness of the substrate edge area 22.

A control device 30 is provided to control the actuation of the piezo-actuators 6. The control device 30 is configured to provide an actuation signal to actuate the piezo-actuators 6. In the embodiment shown in FIGS. 2 and 3, the control device 30 provides a single actuation signal which is simultaneously used for all piezo-actuators 6. The unflatness of the edge area of the substrate 20 is often the same for the whole circumference of the substrate 20. As a result, to compensate the unflatness of the upper surface 24 of the edge area 22 of the substrate 20, a single actuation signal can be used for all piezo actuators 6 to compensate the unflatness of the upper surface of the substrate 20.

In an alternative embodiment of the control device 30, the control device 30 may be configured to provide a separate actuation signal for each piezo actuator, such that the movement of each piezo actuator can be individually controlled. This provides more flexibility to compensate any edge unflatness of the upper surface of the substrate 20 loaded on the substrate support 1, but also requires a more complex control strategy to control each piezo actuator 6 individually. In another alternative embodiment the piezo actuators 6 may be subdivided in groups and each group is actuated by its own actuation signal provided by the control device 30.

In such embodiment, for each target portion of the substrate, or at least for each target portion within the edge area 24 of the substrate 20, a different setting of the piezo-actuators 6 may be required to compensate for the unflatness of the upper surface of the substrate 20.

In order to properly compensate the unflatness of the upper surface of the substrate 20, data should be provided that are representative or indicative for the unflatness of the upper surface of a substrate 20 loaded on the substrate support 1.

This data may for example be obtained by a sensor device 40. This sensor device 40 may measure the unflatness of the upper surface before compensation by the piezo-actuators 6 and provide this data to the control device 30. On the basis of this measured data, the control device 30 may calculate the actuation signals needed to properly compensate the unflatness of the upper surface 24 of the substrate 20.

Dependent on the cause of the unflatness of the upper surface of the substrate 20, different control strategies can be used to compensate for the unflatness.

When the unflatness is caused by unflatness of the support surface of the substrate support, in particular caused by polishing of the burls, the unflatness can be determined during set-up calibration of the lithographic apparatus. Thereafter, the same compensation settings can be used for each substrate 20.

Since the unflatness can also be caused by wear of the support surface, in particular wear of the outer burls 3 of the support surface, the measurement may be repeated regularly to determine whether wear of the burls 3 requires adjustment of the compensation settings.

Unflatness of the upper surface 24 caused by deformation of the substrate 20 itself can be determined by measurement of the upper surface of the specific substrate 20. This data can be measured and stored until the substrate is actually loaded onto the substrate support 1.

Preferably, the required compensation is determined during measurement of the upper surface of the substrate for leveling. Before the pattern is transferred from the patterning device to the substrate, a level map is made of the upper surface of the substrate in order to determine the desired leveling positions used during transfer of a pattern onto the substrate. When during this measurement of the upper surface, higher order unflatness in the edge area 22 is determined, this measurement can also be used to determine desired compensation settings of the piezo actuators 6 during transfer of a pattern onto the upper surface of the substrate 20.

Figure 6:
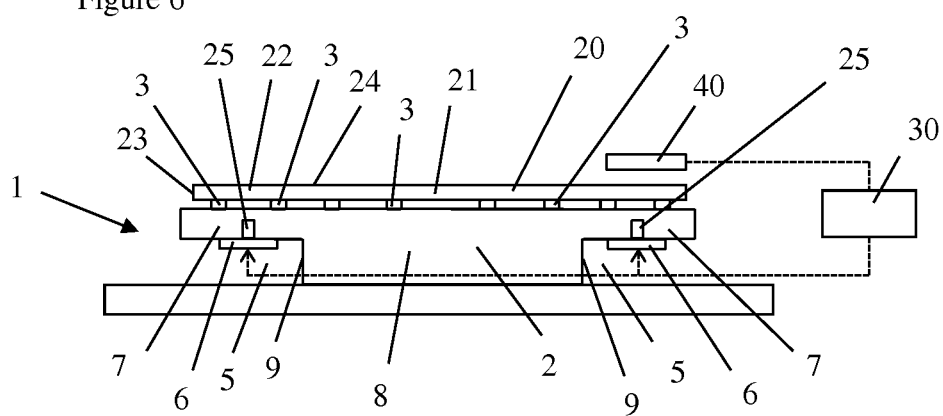
FIG. 6 depicts a cross section view of a second embodiment of a substrate support according to the invention.

FIG. 6 depicts a second embodiment of substrate support 1 according to the invention. In this embodiment, a circumferential groove 25 is provided in the support body 2. The groove 25 is substantially coaxial with the support surface and, as a result, coaxial with a substrate 20 mounted on the support surface of the support body 2. The groove 25 increases the bendability of the support body 2, in particular between the two outer rings of burls 3. The actuators 6 bridge the groove 25, i.e. a first end of the actuator 6 is mounted at one side of the groove 25 and the other end of the actuator 6 is mounted at the other opposed side of the groove 25.

Extension of contraction of the actuator 6 will lead to a curve in the outer body 2 between the two outer rings of burls 3. This results in the outer edge of the support body 2 curving up or down. This displacement of the support body 2 may be used to compensate any unflatness of the upper surface 24 of the substrate 20, in particular in the edge area of the substrate 20.

Hereinabove, the use of piezo actuators to compensate for unflatness of the upper surface of a substrate has been described. However, any other actuator, in particular a linear actuator arranged on the substrate support at a location aligned with the support surface edge part and configured to contract or extend in a direction substantially parallel to a main plane of the support surface may also be used. Types of linear actuators that for instance may be used are pneumatic linear actuators, electrostatic linear actuators, magnetostrictive linear actuators or electrostrictive linear actuators.

In the shown embodiments, the piezo actuators are evenly distributed over the circumference of the support surface and are orientated in radial direction of the support surface. In alternative embodiments any other suitable distribution and/or orientation may also be used. For example, the distribution and/or orientation of piezo actuators may specifically be adapted to the typical deformed shape of substrates. Furthermore, the number of piezo actuators may also be adjusted to any suitable number to substantially compensate the unflatness of the upper surface of the substrate loaded on the substrate support.

The ends of the piezo actuators are aligned with the burls the two outer rings of burls. In alternative embodiments, the ends of the piezo actuators may not be aligned with the burls. Also the piezo actuators may extends, preferably in radial direction over the extent of multiple burls.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A substrate support, comprising:
   a support body forming a support surface configured to support a substrate, wherein the support surface comprises a support surface part configured to support a substrate area of the substrate, wherein the substrate area is a substrate edge area of the substrate and wherein the support surface part is a support surface edge part configured to support the substrate edge area of the substrate; and
   a plurality of actuators arranged on the support body at locations aligned with the support surface part and configured to contract or extend in a direction substantially parallel to a main plane of the support surface,
   wherein the support surface edge part has a reduced thickness with respect to a center part of the support body, the edge part forming the support surface edge part, wherein at least a subset of the plurality of actuators are arranged on the edge part, and
   wherein, upon actuation, at least one actuator is configured to bend a portion of the support surface edge part to compensate an unflatness of an upper surface of an area of the substrate loaded on the support surface.

2. The substrate support of claim 1, wherein the plurality of actuators comprises piezo actuators.

3. The substrate support of claim 1, wherein the support surface is formed by multiple burls of the support body, each burl having a longitudinal axis perpendicular to the support surface, wherein a first burl and a second burl are spaced from each other in a direction substantially perpendicular to an edge of the substrate loaded on the support surface, and wherein the plurality of actuators are arranged to contract or extend in a direction parallel to a line between the longitudinal axis of the first burl and the second burl.

4. The substrate support of claim 1, wherein the support surface edge part of the support surface comprises a circumferential area of the support surface, and wherein the plurality of actuators are distributed over the circumferential area.

5. The substrate support of claim 4, wherein the substrate support comprises a control device, wherein the plurality of actuators are piezo actuators actuated by one of:
   a single control signal of the control device, and
   an individual control signal of the control device.

6. The substrate support of claim 1, wherein the support body comprises an undercut aligned with a part forming the support surface part, wherein the subset of actuators is arranged on the undercut.

7. The substrate support of claim 1, wherein the substrate support comprises a sensor device configured to measure the unflatness of an upper surface of an area of a substrate loaded on the support surface.

8. A method of compensating an unflatness of an upper surface of a substrate area of a substrate loaded on a support surface of a support body of a substrate support, wherein the substrate support comprises at least one actuator mounted on a substrate edge area of the support body and configured to contract or extend in a direction substantially parallel to a main surface of the substrate loaded on the substrate support, wherein the support surface edge part has a reduced thickness with respect to a center part of the support body, the edge part forming the support surface edge part, wherein at least a subset of the plurality of actuators are arranged on the edge part, and wherein the method comprises:
 actuating at least one actuator to extend and/or contract to bend a portion of the support surface edge part on the basis of data representative of unflatness of the upper surface of the substrate area of the substrate loaded on the substrate support to create a curve in the support body, wherein the curve of the support body substantially compensates the unflatness of the upper surface of the substrate area.

9. The method of claim 8, wherein the step of providing data comprises measuring the unflatness of the support surface of the substrate support.

10. The method of claim 8, wherein the step of providing data comprises measuring the unflatness of at least the substrate area of the substrate.

11. The method of claim 10, wherein the step of measuring the unflatness of at least the substrate area of the substrate is carried out when the substrate is loaded on the support surface.

12. A lithographic apparatus configured to transfer a pattern from a patterning device onto a substrate, comprising:
 a substrate support, the substrate support comprising:
  a support body forming a support surface configured to support a substrate, wherein the support surface comprises a support surface part configured to support a substrate area of the substrate, wherein the substrate area is a substrate edge area of the substrate and wherein the support surface part is a support surface edge part configured to support the substrate edge area of the substrate; and
  a plurality of actuators arranged on the support body at locations aligned with the support surface part and configured to contract or extend in a direction substantially parallel to a main plane of the support surface,
  wherein the support surface edge part has a reduced thickness with respect to a center part of the support body, the edge part forming the support surface edge part, wherein at least a subset of the plurality of actuators are arranged on the edge part, and
  wherein, upon actuation, at least one actuator is configured and arranged to bend a portion of the support surface edge part to compensate an unflatness of an upper surface of an area of the substrate loaded on the support surface.

13. A device manufacturing method comprising transferring a pattern from a patterning device onto a substrate, wherein the method comprises:
 loading the substrate on a support surface of a support body of a substrate support, wherein the substrate support comprises at least one actuator mounted on a substrate edge area of the support body and configured to contract or extend in a direction substantially parallel to a main surface of the substrate loaded on the substrate support, wherein the support surface edge part has a reduced thickness with respect to a center part of the support body, the edge part forming the support surface edge part, wherein at least a subset of the plurality of actuators are arranged on the edge part,
 wherein the loading comprises actuating the at least one actuator to extend and/or contract to bend a portion of the support surface edge part on the basis of data representative for unflatness of the upper surface of the substrate area of the substrate loaded on the substrate support, in order to create a curve in the support body, wherein the curve of the support body substantially compensates the unflatness of the upper surface of the substrate area.

* * * * *